US008692366B2

(12) United States Patent
Xue et al.

(10) Patent No.: US 8,692,366 B2
(45) Date of Patent: Apr. 8, 2014

(54) APPARATUS AND METHOD FOR MICROELECTROMECHANICAL SYSTEMS DEVICE PACKAGING

(75) Inventors: Xiaojie Xue, Woborn, MA (US); Carl Raleigh, Reading, MA (US)

(73) Assignee: Analog Device, Inc., Norwood, MA (US)

( * ) Notice: Subject to any disclaimer, the term of this patent is extended or adjusted under 35 U.S.C. 154(b) by 147 days.

(21) Appl. No.: 13/085,294

(22) Filed: Apr. 12, 2011

(65) Prior Publication Data

US 2012/0080764 A1 Apr. 5, 2012

Related U.S. Application Data

(60) Provisional application No. 61/388,489, filed on Sep. 30, 2010.

(51) Int. Cl.
*H01L 23/48* (2006.01)
(52) U.S. Cl.
USPC ............ 257/692; 257/730; 257/E23.181; 257/E23.184
(58) Field of Classification Search
USPC .......... 257/415, 417, 422, E23.181, E23.184, 257/E23.174, E23.079, E23.004, E23.175, 257/692
See application file for complete search history.

(56) References Cited

U.S. PATENT DOCUMENTS

| 3,949,274 A | 4/1976 | Anacker |
| 4,742,183 A | 5/1988 | Soloway et al. |
| 5,126,286 A | 6/1992 | Chance |
| 5,452,182 A | 9/1995 | Eichelberger et al. |
| 5,554,806 A | 9/1996 | Mizuno et al. |
| 5,555,159 A | 9/1996 | Dore |
| 5,616,863 A | 4/1997 | Koen |
| 5,731,222 A | 3/1998 | Malloy et al. |
| 5,903,440 A | 5/1999 | Blazier et al. |
| 6,040,624 A | 3/2000 | Chambers et al. |
| 6,075,708 A | 6/2000 | Nakamura |
| 6,078,102 A * | 6/2000 | Crane et al. .................. 257/730 |

(Continued)

FOREIGN PATENT DOCUMENTS

JP 09121015 A 5/1997

OTHER PUBLICATIONS

Images obtained on Jun. 13, 2011 from a web search related to three-dimensional packaging.

(Continued)

*Primary Examiner* — Wael Fahmy
*Assistant Examiner* — Sarah Salerno
(74) *Attorney, Agent, or Firm* — Knobbe, Martens, Olson & Bear LLP (57) ABSTRACT

A MEMS package includes a substrate having an L-shaped cross-section. The substrate includes a vertical portion having a front surface and a back surface, and a horizontal portion protruding from a lower part of the front surface of the vertical portion, wherein the front surface of the vertical portion includes a mounting region. A MEMS die is mounted on the mounting region such that the MEMS die is oriented substantially parallel to the front surface; a lid attached to the front surface of the substrate while covering the MEMS die; and a plurality of leads formed on a bottom surface of the substrate. The leads can extend substantially parallel to one another, and substantially perpendicular to the front surface. The MEMS die can be oriented substantially perpendicular to a PCB substrate on which the package is mounted.

34 Claims, 8 Drawing Sheets

(56) References Cited

U.S. PATENT DOCUMENTS

| | | |
|---|---|---|
| 6,291,894 B1 | 9/2001 | Farnworth et al. |
| 6,339,191 B1 * | 1/2002 | Crane et al. .................. 174/551 |
| 6,348,427 B1 * | 2/2002 | Hamada et al. ................. 501/32 |
| 6,511,863 B2 | 1/2003 | Farnworth et al. |
| 6,570,246 B1 * | 5/2003 | Lee et al. ...................... 257/690 |
| 6,591,492 B2 | 7/2003 | Farrar |
| 6,705,005 B1 | 3/2004 | Blazier et al. |
| 6,721,189 B1 | 4/2004 | Haba |
| 6,777,261 B2 | 8/2004 | Farnworth et al. |
| 6,852,607 B2 | 2/2005 | Song et al. |
| 6,903,465 B2 | 6/2005 | Farnworth et al. |
| 7,012,812 B2 | 3/2006 | Haba |
| 7,115,984 B2 | 10/2006 | Poo et al. |
| 7,211,886 B2 * | 5/2007 | Hsu et al. ...................... 257/686 |
| 7,265,719 B1 | 9/2007 | Moosbrugger et al. |
| 7,375,009 B2 | 5/2008 | Chua et al. |
| 7,420,262 B2 | 9/2008 | Bauer et al. |
| 7,429,788 B2 | 9/2008 | Clayton et al. |
| 7,467,552 B2 * | 12/2008 | MacGugan ..................... 73/493 |
| 7,839,657 B2 | 11/2010 | Nodine |
| 2003/0209789 A1 | 11/2003 | Hanson et al. |
| 2004/0157410 A1 | 8/2004 | Yamaguchi |
| 2004/0169244 A1 | 9/2004 | MacGugan |
| 2005/0230795 A1 * | 10/2005 | Furuyama et al. ............. 257/678 |
| 2006/0151864 A1 * | 7/2006 | Anderson et al. ............. 257/678 |
| 2006/0261453 A1 * | 11/2006 | Lee et al. ....................... 257/676 |
| 2008/0175425 A1 * | 7/2008 | Roberts et al. ................. 381/361 |
| 2008/0285111 A1 * | 11/2008 | Ishii et al. ...................... 359/290 |
| 2009/0121342 A1 * | 5/2009 | Minakawa et al. ............ 257/712 |
| 2010/0078739 A1 * | 4/2010 | Xue et al. ....................... 257/415 |
| 2010/0197148 A1 | 8/2010 | Rudisill et al. |
| 2011/0018143 A1 | 1/2011 | Chua et al. |
| 2011/0149522 A1 | 6/2011 | Johann et al. |

OTHER PUBLICATIONS

Sensors—HARTING Mitronics, HARTING Pushing Performance, in 2 pages (downloaded from World Wide Web page: harting-mitronics.ch/en/produkte/anwendungen/sensorik/index.php on Jul. 11, 2011).

* cited by examiner

APPARATUS AND METHOD FOR MICROELECTROMECHANICAL SYSTEMS DEVICE PACKAGING

CROSS-REFERENCE TO RELATED APPLICATIONS

This application claims the priority benefit under 35 U.S.C. §119(e) of Provisional Application Ser. No. 61/388,489, filed Sep. 30, 2010. The full disclosure of this priority application is incorporated herein by reference.

BACKGROUND

1. Field

Embodiments of the invention relate to microelectromechanical systems (MEMS) devices, and more particularly, to MEMS device packaging.

2. Description of the Related Technology

Microelectromechanical systems (MEMS) devices refer to very small mechanical devices driven by electricity. MEMS devices can include one or more of mechanical elements, sensors, and actuators formed on a substrate, such as a silicon substrate, through micro fabrication technology. Such MEMS devices, as well as other integrated circuits, in a state before packaging can also be referred to as a "MEMS die" or "die" in the context of this document. In this document, "dies" is used as a plural form of "die," but "dies" or "dice" can also be used as a plural form.

MEMS dies are typically placed in a package (hereinafter, referred to as "MEMS package") to protect the MEMS dies and facilitate electrical connection to larger electronic devices. Such MEMS packages are often designed to be attached to a printed circuit board (PCB) or similar interface for larger devices. A MEMS package can typically include a casing having a cavity to contain a MEMS die, bond pads for electrical connection to the MEMS die, leads for electrical connection to a larger device, and interconnects for electrical connection between the bond pads and the leads. A MEMS die is attached to a mounting surface of the MEMS package inside the cavity, and can be electrically connected to the bond pads, e.g., via bond wires.

SUMMARY

In one embodiment, a microelectromechanical systems (MEMS) package comprises an L-shaped substrate. The substrate comprises: a vertical portion having a horizontal top surface, a vertical front surface, and a vertical back surface, wherein the front surface of the vertical portion includes a mounting region; a horizontal portion protruding horizontally from a lower part of the front surface of the vertical portion; and a plurality of leads formed on a bottom surface of the substrate. The package also includes a MEMS die mounted on the mounting region of the substrate such that the MEMS die is oriented substantially parallel to the front surface; and a lid attached to the front surface of the substrate while covering the MEMS die. The illustrated configuration facilitates mounting the MEMS die substantially perpendicular to a PCB substrate on which the package is mounted.

In another embodiment, a substrate for a microelectromechanical systems (MEMS) package comprises a substrate having an L-shaped cross-section. The substrate comprises: a vertical portion having a vertical front surface and a vertical back surface, wherein the vertical portion includes a mounting region on the front surface, bond pads on the mounting region, and interconnects electrically coupled to the bond pads. The substrate also includes a horizontal portion protruding horizontally from a lower part of the front surface of the vertical portion, wherein the front surface of the vertical portion includes a mounting region. The substrate further includes a plurality of leads formed on a bottom surface of the substrate.

In yet another embodiment, a method of making a microelectromechanical systems (MEMS) package comprises providing a substrate comprising a first portion having a first surface including a plurality of die mounting regions, and a second portion elevated from the first surface of the first portion. The second portion is positioned outside the mounting regions. The substrate further includes a plurality of through-holes formed through the second portion, and a conductive material formed on inner surfaces of the through-holes. The method further includes partitioning the substrate into individual MEMS packages such that each of the MEMS packages includes one of the mounting regions with a plurality of leads formed by portions of the through-holes coated with the conductive material. In another embodiment, the through-holes can be coated with a conductive material and then filled with a conductive or non-conductive material. In yet another embodiment, the through-holes can be filled with a conductive material.

In yet another embodiment, a method of making a microelectromechanical systems (MEMS) package is provided. The method comprises providing a substrate having an L-shaped cross-section. The substrate comprises a vertical portion having a vertical front surface and a vertical back surface, and a horizontal portion protruding horizontally from a lower part of the front surface of the vertical portion. The front surface of the vertical portion includes a mounting region, and the substrate further comprises a plurality of leads formed on a bottom surface of the substrate. The method also includes mounting one or more MEMS dies on the mounting region of the substrate such that the MEMS dies are oriented substantially parallel to the front surface; and attaching a lid to the front surface of the substrate so as to cover the one or more MEMS dies.

DETAILED DESCRIPTION OF EMBODIMENTS

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Vertical Mount MEMS Packages

A MEMS package is designed to protect a MEMS device and facilitate electrical connection to larger electronic devices. In some applications, a MEMS package can be mounted on a printed circuit board (PCB) such that a MEMS device therein is oriented substantially parallel to a mounting surface of the PCB. In other applications, a MEMS package desirably has a MEMS device therein oriented substantially perpendicular to a mounting surface of a PCB because of the operation of the MEMS device.

For example, in some automotive applications, such as vehicle stability control devices, rotation or angular sensors (alternatively, referred to as "gyroscopes") and/or motion sensors (alternatively, referred to as "accelerometers") are oriented vertically on a horizontally mounted part inside a vehicle. In the context of this document, the term "vertical" can refer to the orientation perpendicular to the package mounting plane (e.g., on a motherboard), which is often perpendicular to ground. Rotation sensors and motion sensors can be collectively referred to as "inertial sensors."

In such an instance, such inertial sensors can be oriented vertically using a vertical mount MEMS package which itself is mounted vertically on a horizontal mounting surface of a PCB. However, known schemes for vertical mount MEMS packages can be expensive and have several limitations. For example, as vertical mount MEMS packages can be more susceptible to vibration and package tilt than horizontal mount MEMS packages. Accordingly, there is a need for providing a vertical mount MEMS package that can tolerate such conditions such that the operations of MEMS devices therein are not adversely affected. Among other attributes, vertical mount MEMS packages should have good EMI shielding capability, stress isolation, vibration immunity, solder joint reliability, and lead inspectability, and low cost.

In one embodiment, a vertical mount MEMS package can include an L-shaped substrate including a vertical portion and a horizontal portion. The vertical portion includes a mounting region for mounting one or more MEMS dies and providing electrical connections to the MEMS dies. The MEMS package further includes a lid covering the mounting region while providing a cavity for containing the MEMS dies and the electrical connections. In addition, the MEMS package includes a plurality of leads on a bottom surface of the substrate.

Figure 1A:
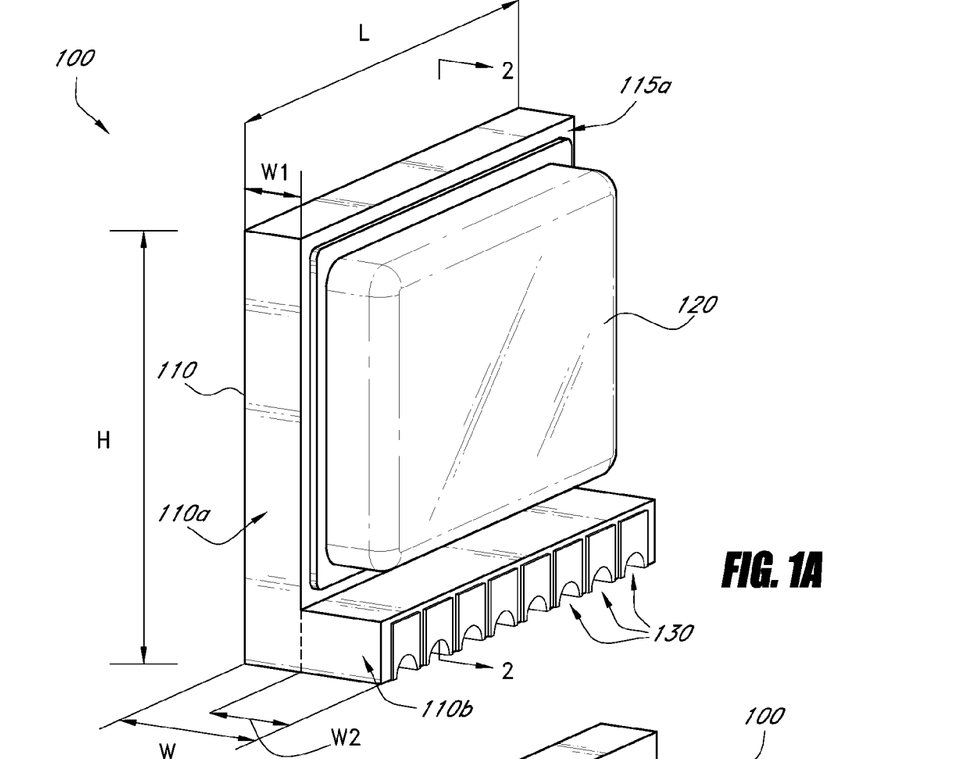
FIG. 1A is a schematic perspective front view of a MEMS package according to one embodiment.
Figure 1B:
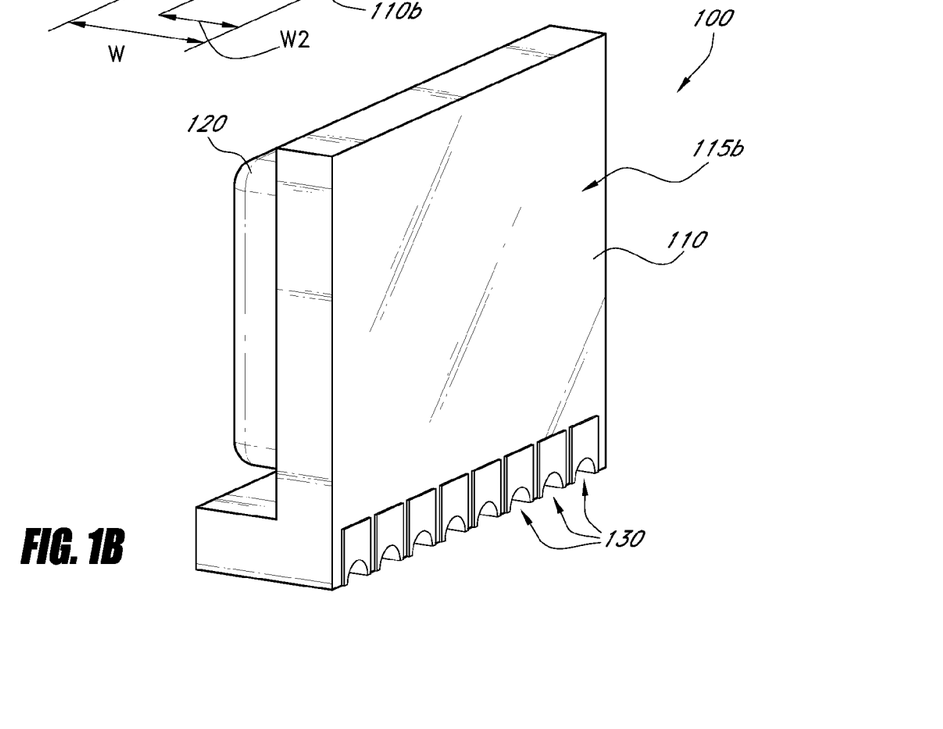
FIG. 1B is a schematic perspective back view of the MEMS package of FIG. 1A.

Referring to FIGS. 1A-1E and 2, a vertical mount MEMS package according to one embodiment is shown. As shown in FIGS. 1A and 1B, the illustrated MEMS package 100 includes a substrate 110, a lid 120, and a plurality of leads 130. The MEMS package 100 can be attached to a larger electronic device, such as by way of a printed circuit board (PCB) (not shown), by attaching the leads 130 to the PCB, using, for example, solder joints.

The substrate 110 serves to support one or more integrated circuit dies. The dies can include one or more MEMS devices therein. The substrate 110 has an L-shape which has a vertical portion 110a extending upward from the bottom of the substrate 110, and a horizontal portion 110b extending horizontally from a lower part of the vertical portion 110a. The vertical portion 110a includes a first surface (or front surface) 115a and a second surface (or back surface) 115b that is shown in FIG. 1B. In one embodiment, the vertical portion 110a and the horizontal portion 110b can be integrated with each other. In another embodiment, the vertical portion 110a and the horizontal portion 110b can be laminated or attached to each other.

The vertical portion 110a has a height H (which extends from the bottom of the substrate 110 to the topmost surface of the substrate 110) and a first width W1. The horizontal portion 110b has a width W2. The substrate 110 has a width W (which is equal to a sum of W1 and W2), and a length L. The widths W1, W2, W are dimensions extending perpendicular to the first or front surface. The length L is a dimension extending perpendicular to the widths and height. In one embodiment, the height H can be between about 3 mm and about 15 mm. The simplicity of the design allows for a particularly low vertical profile, e.g., less than 5.2 mm, for applications with limited space or height. The first width W1 can be between about 0.2 mm and about 7 mm. The second width W2 can be between about 0.2 mm and about 7 mm. The width W can be between about 0.5 mm and about 14 mm. The length L can be between about 3 mm and about 25 mm.

The substrate 110 can have a height-to-width (H/W) ratio of about 0.2 to about 30. The lower the height-to-width ratio is, the greater is the vibration immunity of the package 100. On the other hand, minimizing the width of the package facilitates mounting on crowded motherboards. In one embodiment, the substrate 110 can have a width W of about 3 mm or greater, and a length L of about 3 mm or greater. An area of the bottom of the substrate 110, i.e., W×L of the substrate 110 can be about 9 mm² or greater. The area can be relevant to stability of mounting surface and extent of contact surface for solder joint reliability.

In one embodiment, the substrate 110 can be formed of, for example, a polymeric material, such as a liquid crystal polymer (LCP) or polyphthalamide (PPA), with preformed leadframes. In another embodiment, the substrate 110 can be formed of a ceramic material (which can provide effective hermetic sealing). In some embodiments, the substrate 110 can be in a form of a printed circuit board (PCB) having layers with metal routing traces formed therein. In other embodiments, the substrate 110 can be a pre-molded plastic substrate with plated metal traces. In some embodiments, the material of the substrate 110 of the package 100 can be matched with the material of a PCB on which the package 100 is to be mounted in order to reduce thermal mismatch, thereby improving solder joint reliability (SJR).

Figures 1C, 1D:
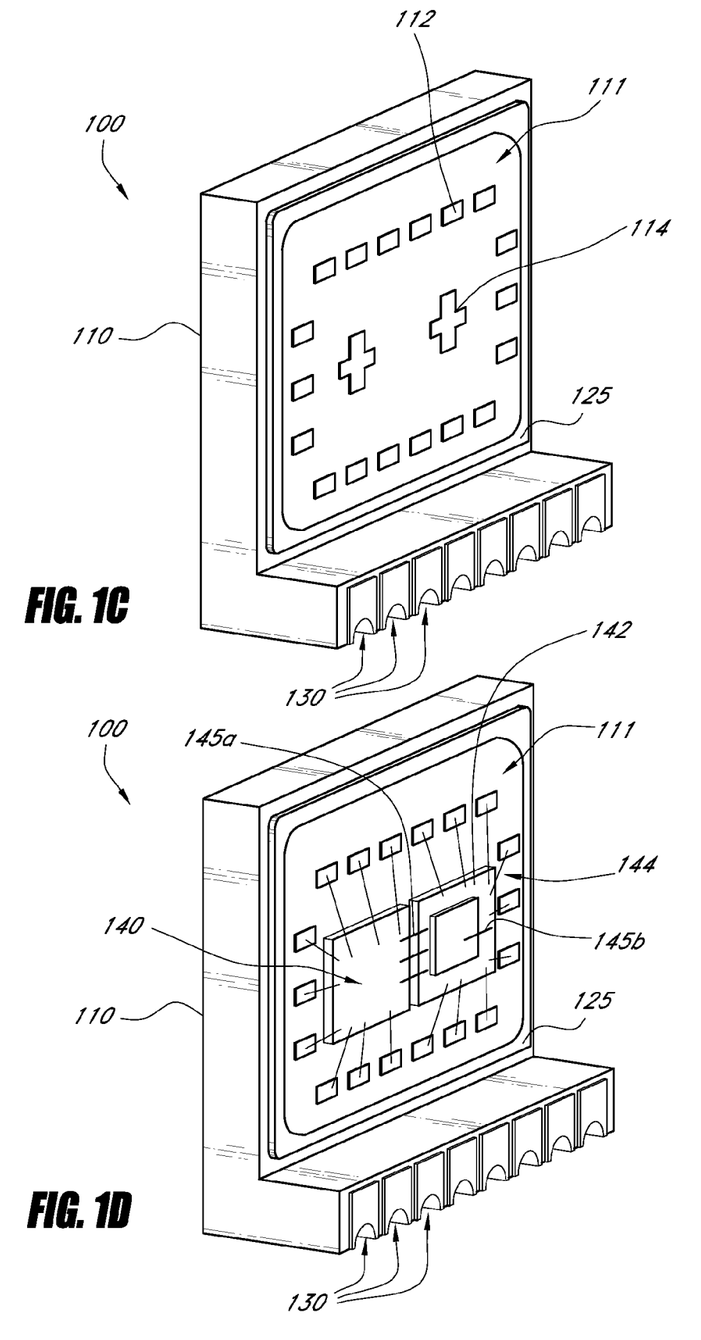
FIG. 1C is a schematic perspective front view of the MEMS package substrate of FIG. 1A prior to mounting a MEMS die.
FIG. 1D is a schematic perspective front view of the MEMS package of FIG. 1A with multiple dies mounted on the package substrate prior to lid attachment.

With reference to FIG. 1C, the substrate 110 can also include electrical contacts in the form of bond pads 112 and die mounts 114 on a mounting surface 111 of the substrate 110. FIG. 1C shows the package substrate 110 prior to mounting any die or lid thereon. The term "die mounting surface" can also be referred to as a "die mounting region" or "mounting region" in the context of this document. The bond pads 112 can be positioned around a region on which dies are to be attached and within a seal ring 125 to which the lid will be mounted. A skilled artisan will, however, appreciate that the bond pads can be positioned at any suitable locations.

The die mounts 114 serve to provide an elevated surface on which dies are to be mounted. The die mounts 114 elevate the dies from the mounting surface 111 of the substrate 110 and can reduce stress imparted to the dies. The die mounts 114 are shown as a cross-shape in FIG. 1C to reduce contact surfaces at the corners of the dies, although other shapes, such as a square shape or an annular shape, may be used. In other embodiments, two or more separated die mounts can be provided for mounting a single die. In other embodiments, a package may not include a die mount.

With reference to FIG. 1D, dies 140, 142 can be mounted on the die mounts 114 on the mounting surface 111 of the substrate 110. FIG. 1D shows the package 100 after die mounting and wire bonding but before attaching the lid. In the illustrated embodiment, the MEMS package 110 includes two dies 140, 142. In other embodiments, the number of dies in a MEMS package can vary widely, depending on the design of the MEMS package. For example, a MEMS package can include a single die, or three or more dies. In some embodiments, a MEMS package can include one or more MEMS dies, and one or more Application-Specific Integrated Circuit (ASIC) dies.

Each of the MEMS dies can include one or more MEMS devices, such as a gyroscope, an accelerometer, a MEMS thermal sensor, and the like. In some embodiments, two or more MEMS dies can be stacked over one another, or attached to one another side-by-side. One or more of the MEMS dies can include a die substrate, and a die cap formed over the die substrate. The die substrate and cap can be formed of, for example, silicon. The die cap can serve to protect MEMS structures on the die substrate.

Each of the ASIC dies can include a processor, volatile and/or non-volatile memory blocks, and the like for operation of the MEMS devices on the MEMS dies. A skilled artisan will appreciate that ASIC dies can include various other components, depending on the design of the MEMS devices in the package 100.

The dies 140, 142 are electrically coupled to the bond pads 112 via bond wires 144, as shown in FIG. 1D, or by any other suitable method, such as flip-chip or bumps. In certain embodiments, at least some portions of the dies 140, 142, the bond pads 112, and the bond wires 144 can be coated with a sealing material to protect their exposed surfaces.

The lid 120 (FIG. 1A) serves to provide an enclosed space for the dies 140, 142, the bond pads 112, and the bond wires 144. The lid 120 has a cavity formed therein such that the lid 120 does not contact the dies 140, 142, the bond pads 112, or the bond wires 144 when the lid 120 is attached to the substrate 110. By having the lid 120 spaced from the dies 140, 142 without an encapsulant, the dies 140, 142 can minimize stress and allow free motion for MEMS membranes. The lid 120 can be attached to the substrate 110, using solder or conductive adhesive material formed along the seal ring 125 at the periphery of the mounting surface 111 of the substrate 110, shown in FIGS. 1C and 1D.

The lid 120 can also serve as an EMI shield for the dies 140, 142. The lid 120 can be electrically coupled to one of the leads 130 that can be connected to electrical ground. In one embodiment, the lid 120 can be formed of a metal, such as aluminum, or stainless steel. In another embodiment, the lid 120 can be formed of a plastic material. In such an embodiment, the lid 120 can be coated with a conductive material such as a metal film. The MEMS package 100 can optionally have an additional EMI shield for shielding the dies 140, 142 from electromagnetic waves from the back or side opposite the lid 120, as will be described in detail in connection with FIGS. 4, 5A, and 5B.

The leads 130 serve to provide electrical connection between the dies 140, 142 and the larger electronic system, e.g., through pads of a PCB (not shown) on which the package 100 is mounted. Further, the leads 130, by being attached to the pads via solder joints, provide mechanical support for the MEMS package 100. In the illustrated embodiment, the leads 130 are elongated parallel to one another in a direction perpendicular to the mounting surface 111 of the substrate 110. The leads 130 extend along at least a portion of the width W of the package 100. In the illustrated embodiment, the leads 130 extend along substantially the entire width W of the package 100.

Figure 1E:
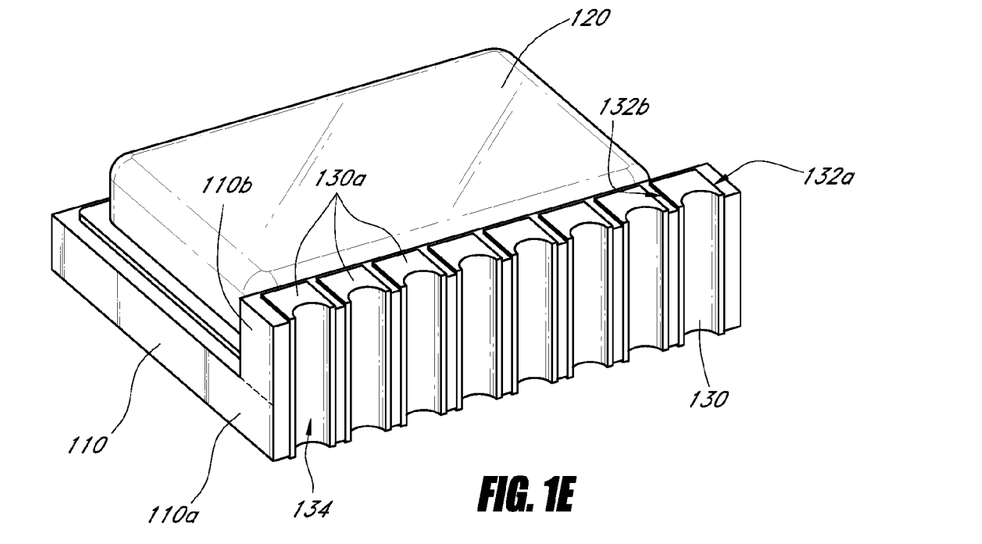
FIG. 1E is a schematic perspective bottom view of the MEMS package of FIG. 1A.
Figure 2:
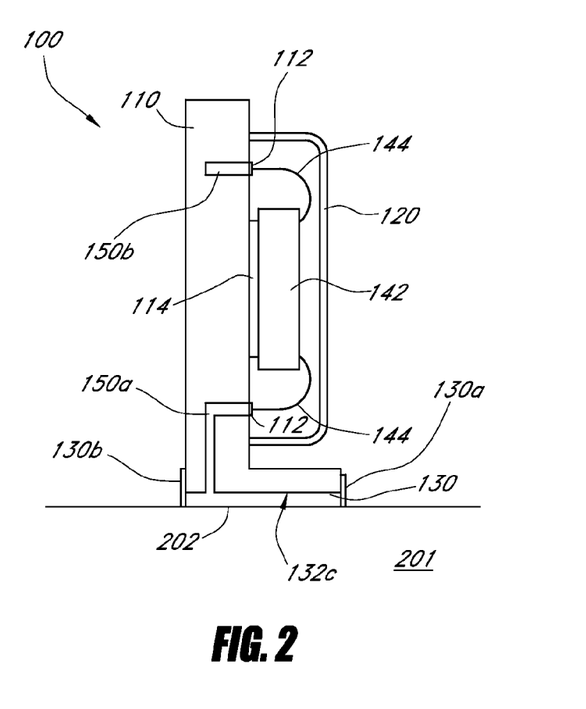
FIG. 2 is a schematic elevational cross-section of the MEMS package of FIG. 1A, taken along lines 2-2 of FIG. 1A.

With reference to FIG. 1E and 2, the illustrated leads 130 are recessed in grooves or trenches 132 formed in a lower part of the vertical portion 110a and the horizontal portion 110b. The grooves 132 have side surfaces 132a, 132b and a ceiling surface 132c (FIG. 2). It will be understood from FIGS. 3A-3G discussed below that the ceiling surface 132c can be curved. Each of the leads 130 fills substantially the entire portion of a respective one of the grooves 132 while having a concave bottom surface 134. The concave bottom surface 134 can provide greater surface area for bonding with solder when the package 100 is attached to a PCB. In another embodiment, the bottom surfaces of the leads 130 can be substantially planar. A skilled artisan will appreciate that the leads 130 can have various other structures, depending on the design of a PCB to which the package 100 is to be attached.

The leads 130 are visible from both the front and back sides of the package 100 after being mounted on a PCB. Further, the end portions of the grooves 132 are open, as shown in FIGS. 1A and 1B. In other words, the grooves 132 are open in directions in which the front and back surfaces 115a, 115b face. Thus, the end portions of solder joints, which are interposed between the leads 130 and the PCB after the package 100 is mounted on the PCB, are also visible. This configuration permits easy inspection of the leads and solder joints after mounting.

The leads 130 can also be provided with pads at both ends. In the illustrated embodiment, a plurality of first pads 130a are formed on the front surface of the horizontal portion 110b (which is substantially parallel to the front surface of the vertical portion 110a). Each of the first pads 130a extends from one end of a respective one of the leads 130 formed inside the grooves 132. The first pads 130a can be formed by a thin layer or plate, and they increase the portion of the leads 130 covering the front surface. The first pads 130a are separate from one another for electrical separation. A plurality of similar second pads 130b (FIG. 2) are formed on a lower part of the back surface of the vertical portion 110a.

The first and second pads 130a, 130b allow a non-wetting solder joint failure to be optically inspected. The term "non-wetting solder joint failure" refers to a solder joint failure caused by solder forming ball shapes around the joint without adhering to leads. When there is a non-wetting solder joint failure, at least part of the solder does not adhere to the pads 130a, 130b, thereby exposing the pads 130a, 130b, which can be visually inspected easily.

Further, the larger the area of contact between leads of a package and a PCB, the better is the solder joint reliability (SJR) of the package. In the illustrated embodiment, the leads 130 have a relative long length, extending the entire width W of the mounting surface, thereby improving solder joint reliability.

As shown in FIG. 2, the substrate 110 also includes interconnects 150a, 150b to electrically couple the dies 140, 142 to the leads 130, thereby electrically coupling the dies 140, 142 to a PCB 201 via solder joints 202. The interconnects 150a, 150b are embedded in the substrate 110, and are formed of an electrically conductive material. Each of multiple interconnects 150a, 150b can be electrically coupled between one of the bond pads 112 and a respective one of the leads 130, although only one such connection is visible in the cross section of FIG. 2. In embodiments with multiple dies, at least one of the interconnections 150a, 150b can serve to provide electrical connection between the dies 140, 142 (for example, between an ASIC die and a MEMS die). Further, one or more bond wires 145a, 145b can alternatively provide direct electrical connection between the dies 140, 142 or between stacked dies 142.

Method of Making a Vertical Mount MEMS Package

Referring to FIGS. 3A-3G, a method of making a vertical mount MEMS package according to one embodiment will be described below. In the illustrated embodiment, a first PCB substrate 210a having embedded metal routing traces (not shown) is provided. The first PCB substrate 210a can have routing/mounting structures, such as bond pads and die mounts (see FIG. 1C), in die mounting regions 211a-211d on which dies are to be mounted. In the illustrated embodiment, four packages are to be formed from the single first substrate 210a, and thus the substrate 210a includes four sets of routing/mounting structures for mounting dies in the four regions 211a-211d. The skilled artisan will appreciate that many more packages can be formed from a single substrate during manufacturing, and that a simple four-package process is shown in FIGS. 3A-3G for purposes of illustration.

Figure 3A:
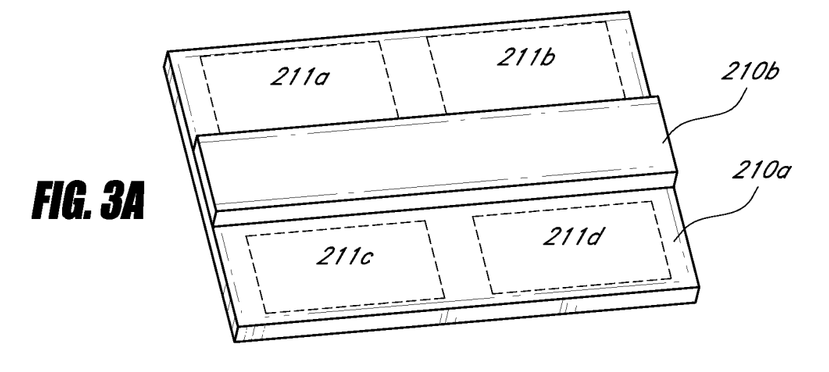
FIGS. 3A-3G are perspective views illustrating a method of making a MEMS package according to one embodiment.
Figure 3B:
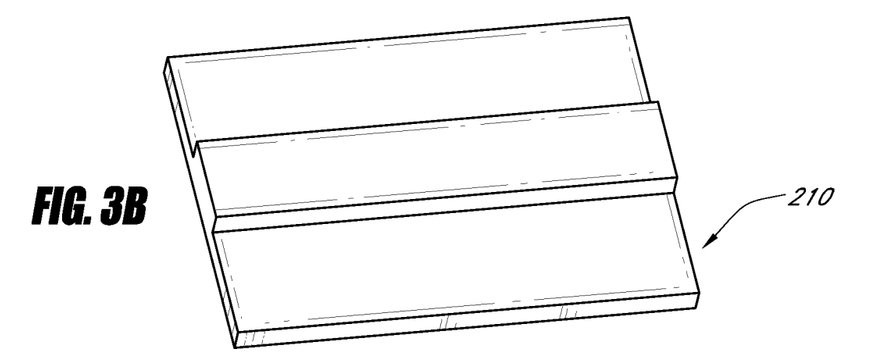

A second PCB substrate 210b is placed onto the first PCB substrate 210a between two rows of the regions 211a-211d, as shown in FIG. 3A. The second PCB substrate 210b is laminated onto the first PCB substrate 210a, using any suitable process, including, but not limited to, heating the substrates 210a, 210b, and pressing the second substrate 210b against the first substrate 210a, with or without intervening adhesive. A resulting integrated "laminated" substrate 210 is shown in FIG. 3B.

Figure 3C:
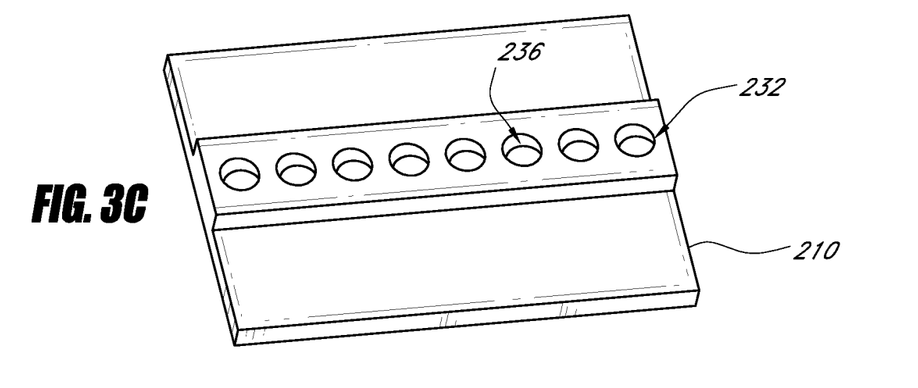

Subsequently, a plurality of through-holes 232 are formed through the laminated substrate 210, as shown in FIG. 3C. The through-holes 232 are formed through the first and second PCB substrates 210a, 210b, and are aligned with one another. While FIG. 3C shows eight through-holes, the number of the through-holes 232 can vary depending on the number of leads desired for each of MEMS packages formed by the method. In the simplified illustrated embodiment, four MEMS packages (two MEMS packages on one side of the second substrate 210b, and another two MEMS packages on the other side of the second substrate 210b) are formed by the method. Each of the MEMS packages can have, for example, eight leads, which would need sixteen through-holes for the four-package example of FIGS. 3A-3G. However, only eight through-holes are shown in FIG. 3C for simplicity.

Figure 3D:
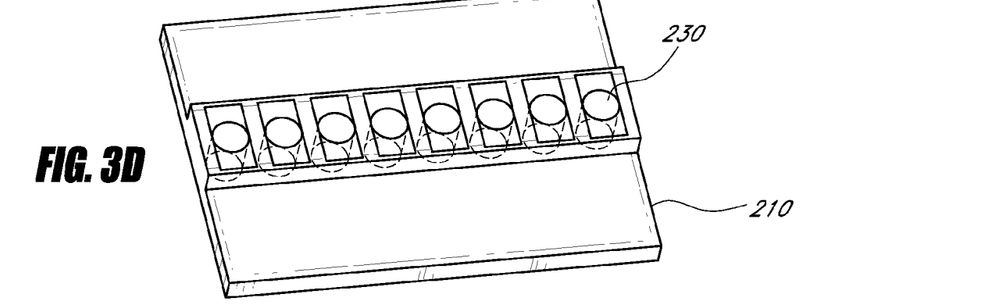

The through-holes 232 are formed so as to have inner side surfaces 236 which expose portions of interconnects (not shown) embedded in the first substrate 210a. The round through-holes 232 of FIG. 3C have advantages for adhesion and manufacturing, but other shapes are possible. Then, deposition (e.g., electroplating) is performed to form lead structures 230 inside the through-holes 232, as shown in FIG. 3D. In the illustrated embodiment, the lead structures 230 are formed conformally with the inner side surfaces 236 of the through-holes 232 while contacting the exposed portions of the embedded interconnects. In another embodiment, the through-holes 232 can be coated with a conductive material, and then filled with the same or a different conductive material to increase the conductivity. In yet another embodiment, the through-holes 232 can be coated with a conductive material, and then filled with a non-conductive material. In yet another embodiment, the through-holes 232 can be completely filled with a conductive material, e.g., by a single plating or other deposition process.

Further, pads (such as the first and second pads 130a, 130b shown in FIG. 2) can also be formed as part of the lead structure 230 on top and/or bottom surfaces of the laminated substrate 210. The pads can be formed by the same deposition process as the lead structures on the inner side surfaces 236 of the through-holes 232 or by one or more subsequent deposition processes.

Subsequently, dies are attached to the four regions 211a-211d of the laminated substrate 210, and bond wires are formed to couple the dies and the bond pads. Optionally, at least a portion of a top surface of the resulting structure can be coated with a protective material, such as silicone gel to prevent moisture incursion. In an embodiment in which the substrate is formed of a ceramic material and the lid is solder attached thereto, the package can be hermetic, which obviates any such coating under the lid. Subsequently, a sealant is formed annularly along peripheries of the regions 211a-211d of the substrate 210 to surround the regions 211a-211d. Four lids 220a-220d are attached to the substrate 210 to cover the four regions 211a-211d, as shown in FIG. 3E.

Figures 3E, 3F:
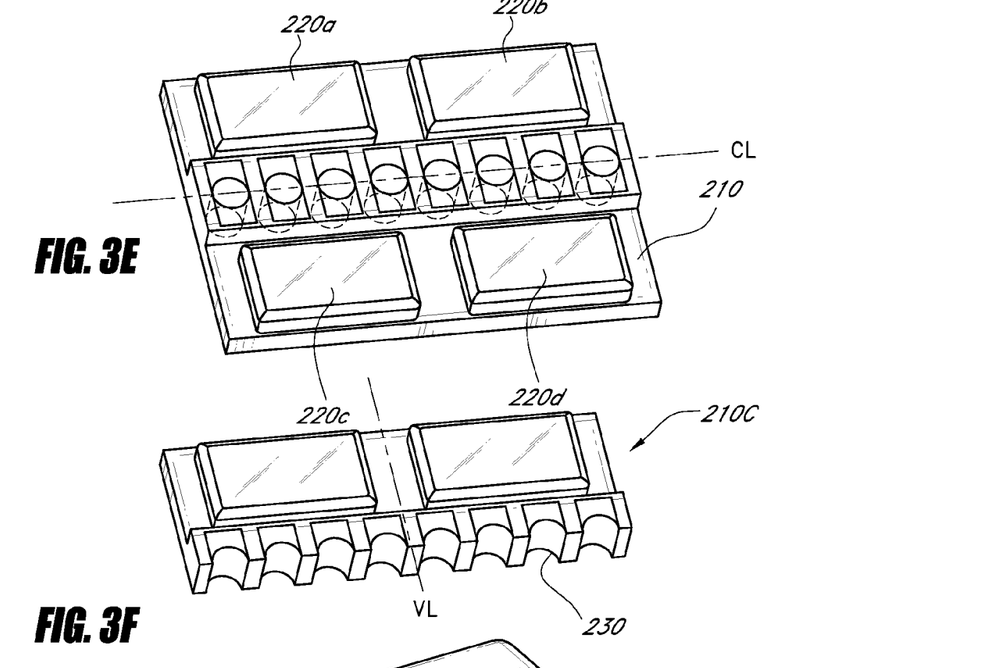
Figure 3G:
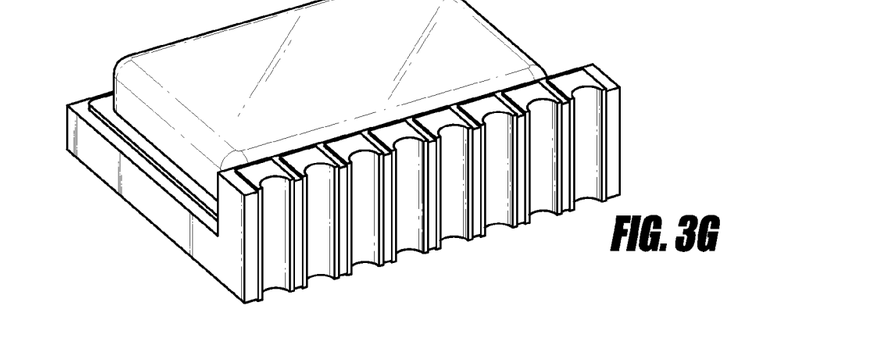

Subsequently, the resulting structure is partitioned by, for example, saw singulation, into two pieces along a central line CL of the second substrate 210b in a longitudinal direction, as shown in FIG. 3F. The resulting structure 210c has two MEMS packages while having completed lead structures 230. The structure 210c is further sawed along a vertical line VL into two pieces to form individual MEMS packages as shown in FIG. 3G. By making multiple packages simultaneously, the manufacturing cost of the packages can be reduced. Alternatively, the package substrates can be first singulated, and dies and lids can be mounted thereafter for individual packages.

In another embodiment, the substrate 210 having a structure similar to that of FIG. 3D can be formed by, for example, injection molding, rather than lamination as described above in connection with FIGS. 3A-3C. In such an embodiment, a lead frame including pre-formed leads, interconnects, and bond pads, can be encapsulated by injection molding to form a partially fabricated MEMS package. Then, one or more dies can be attached to and wire bonded to the partially fabricated MEMS package, and a lid can be provided to cover the dies. In such an embodiment, multiple MEMS packages can be formed on a single substrate, and sawed into individual MEMS packages similar to the steps shown in FIGS. 3E-3G. In yet another embodiment, substrates for individual MEMS packages can be formed singularly, which would not entail singulation after making multiple MEMS packages on a single substrate.

Vertical Mount MEMS Packages with EMI Shielding

Figure 4:
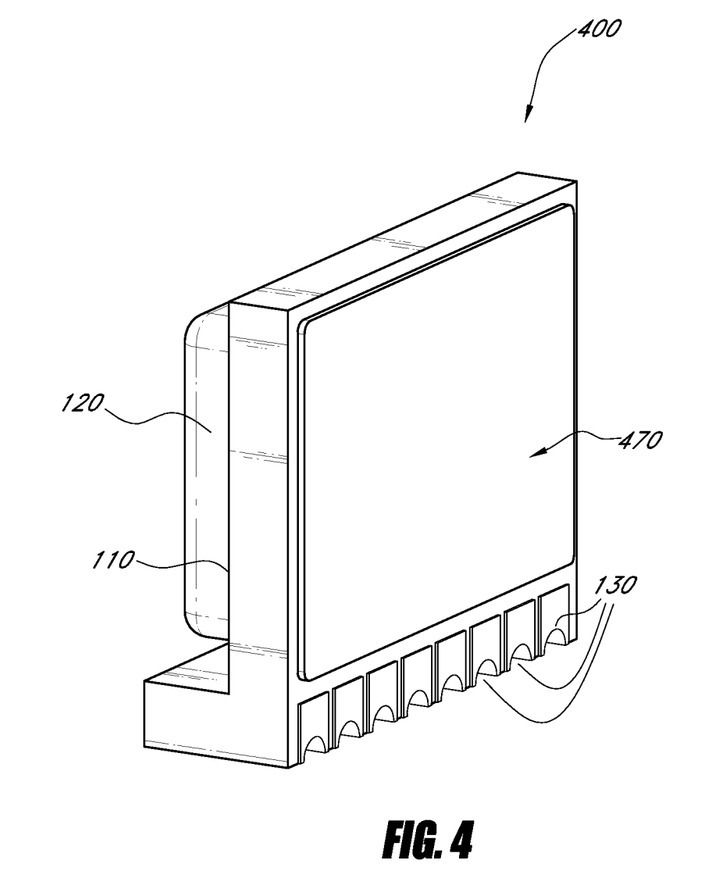
FIG. 4 is a schematic perspective back view of a MEMS package having an EMI shield back plate according to another embodiment.

Referring to FIG. 4, a MEMS package having EMI shielding capability according to another embodiment will be described below. The illustrated MEMS package 400 can include an L-shaped substrate 110, a lid 120, leads 130, and an EMI shielding back plate 470. Details of the substrate 110, the lid 120, and the leads 130 can be as described above in connection with those of the package 100 of FIGS. 1A-1E and 2. The EMI shielding back plate 470 is formed on the backside of the substrate 110, and can be attached, e.g., by using solder or conductive epoxy, such that substantially the entire portion of the backside of the substrate 400 is covered with the back plate 470. The back plate 470 is formed of a conductive material, and is electrically coupled to electrical ground by internal or external connection to one of the leads 130. The conductive back plate 470 and the conductive or conductively coated lid 120 together serve to provide EMI shielding for dies inside the package 400.

In another embodiment, a MEMS package can include an EMI shield plate embedded within the substrate of the MEMS package. In such an embodiment, the EMI shield plate can be embedded close to the backside surface of the substrate and isolated from internal interconnects to non-ground leads.

Figure 5A:
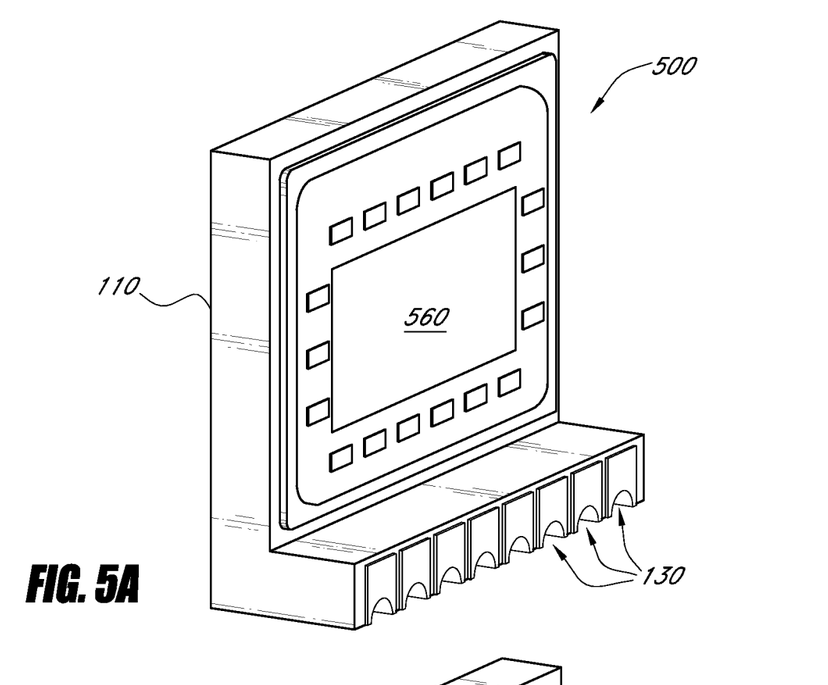
FIG. 5A is a schematic perspective front view of a MEMS package substrate having an inner EMI shield mounting pad according to yet another embodiment.
Figure 5B:
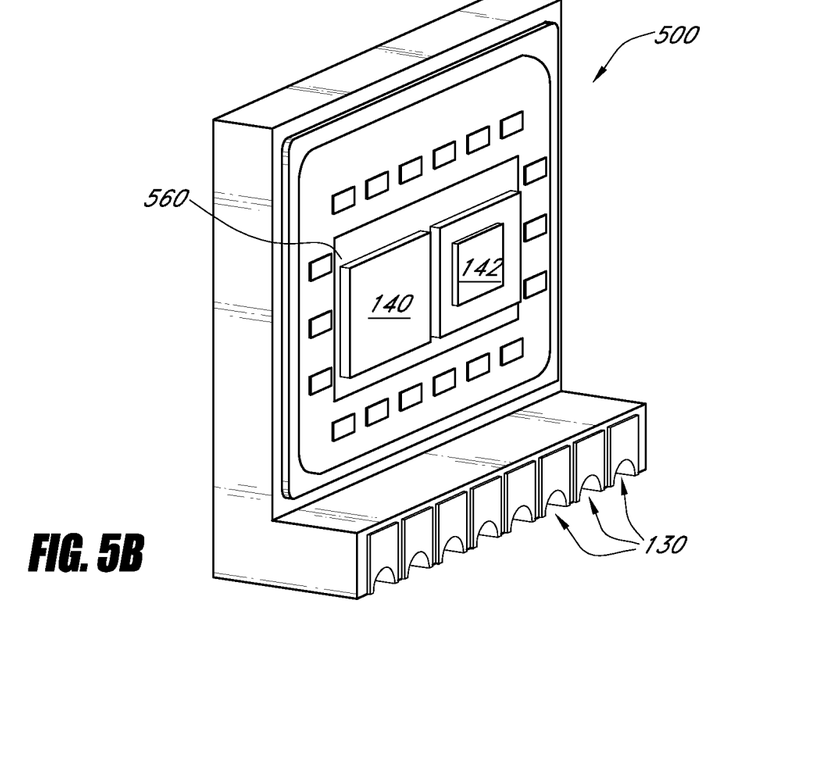
FIG. 5B is a schematic perspective front view of the MEMS package of FIG. 5A after MEMS dies are mounted thereon.

Referring to FIGS. 5A and 5B, a MEMS package having EMI shielding capability according to yet another embodiment will be described below. FIG. 5A illustrates a partially fabricated MEMS package before dies are mounted thereon. In the illustrated embodiment, the MEMS package includes a conductive die paddle 560 formed on a die mounting region of the substrate 110 of the package 500. The conductive die paddle 560 can be formed of a conductive material, and electrically connected to electrical ground via one of the leads 130. Dies 140, 142 can be mounted over the conductive die paddle 560, as shown in FIG. 5B. In one embodiment, the dies 140, 142 are attached to the conductive die paddle 560, as shown. In another embodiment, die mounts can be formed on the conductive die paddle 560 so that dies can be elevated from the conductive die paddle 560, similar to the die mounts 114 described above in connection with FIG. 1C. The conductive die paddle 560 and the conductive or conductively coated lid 120 (not shown in FIG. 5B) together serve to provide EMI shields for the dies 140, 142 inside the package 500.

Vertical Mount MEMS Packages with Horizontal Mount Option

Figure 6:
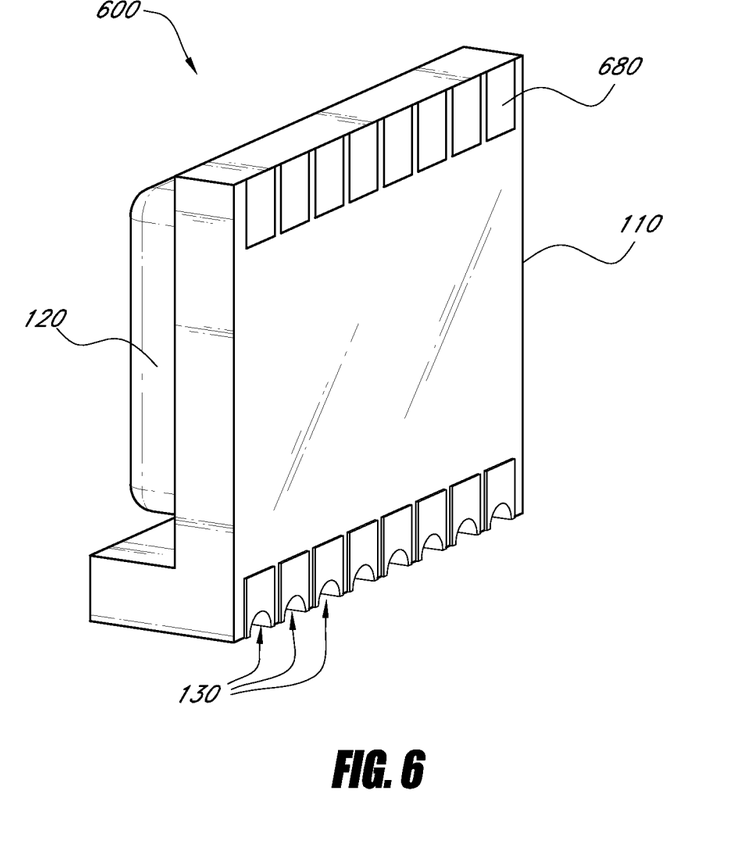
FIG. 6 is a schematic perspective back view of a MEMS package having additional leads for optional horizontal mounting according to yet another embodiment.

Referring to FIG. 6, a vertical mount MEMS package having a horizontal mount option according to yet another embodiment will be described below. The illustrated MEMS package 600 includes an L-shaped substrate 110, a lid 120, leads 130 for vertical mounting, and leads 680 for horizontal mounting. The leads 680 for horizontal mounting are formed on the backside of the substrate 110 at top portions of the vertical portion thereof. The number of the leads 680 can be the same as the number of the leads 130.

In certain applications, the MEMS package 600 should be oriented horizontally. In other words, the backside of the MEMS package 600 is to face a surface of a PCB. In such an instance, the leads 680 for horizontal mounting of the package 600 are bonded to the PCB. To achieve the horizontal mounting, both the leads 680 and the leads 130 can be soldered to the PCB, which can enhance mechanical stability. In another embodiment, only the leads 680 can be soldered to the PCB. In yet another embodiment, only the leads 130 can be soldered to the PCB. Thus, the MEMS package 600 is more versatile and can be used in either vertical or horizontal orientation without making any design change. In this example, internal interconnects can redundantly lead from each bond pad to both a vertical mount lead 130 and a horizontal mount lead 680.

The configurations described in the above embodiments can provide vertical mount MEMS packages having a desired height, while maintaining good stability. The MEMS packages can also have good EMI shield capability, stress isolation, vibration immunity, solder joint reliability, and leads inspectability. Further, the MEMS packages can be made at a relatively low cost.

Applications

The embodiments described above can be adapted for various types of MEMS devices, including, but not limited to: inertial sensors (for example, gyroscopes and accelerometers), MEMS thermal sensors, microphone, and pressure sensors. The packages have particular utility for vertically mounting sensors, such as gyroscopic angular motion sensors, to achieve the detection at a certain orientation.

More generally, packages employing the above described configurations can be used for various electronic devices. Examples of the electronic devices can include, but are not limited to, consumer electronic products, parts of the consumer electronic products, electronic test equipments, etc. The consumer electronic products can include, but are not limited to, vehicles (for example, stability control devices), a mobile phone, cellular base stations, a telephone, a television, a computer monitor, a computer, a hand-held computer, a netbook, a tablet computer, a digital book, a personal digital assistant (PDA), a game controller, a GPS, a stereo system, a cassette recorder or player, a DVD player, a CD player, a VCR, a DVR, an MP3 player, a radio, a camcorder, a camera, a digital camera, a portable memory chip, a copier, a facsimile machine, a scanner, a multi functional peripheral device, a wrist watch, a clock, etc. Further, the electronic device can include unfinished products.

The foregoing description and claims may refer to elements or features as being "mounted" or "attached" together. As used herein, unless expressly stated otherwise, "mounted" means that one element/feature is directly or indirectly connected to another element/feature. Likewise, unless expressly stated otherwise, "attached" means that one element/feature is directly or indirectly coupled to another element/feature. Thus, although the various schematics shown in the figures depict example arrangements of elements and components, additional intervening elements, devices, features, or components may be present in an actual embodiment.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A microelectromechanical systems (MEMS) package comprising:
   an L-shaped substrate comprising:
      a vertical portion having a horizontal top surface, a vertical front surface, and a vertical back surface, wherein the front surface of the vertical portion includes a mounting region;
      a horizontal portion protruding horizontally from a lower part of the front surface of the vertical portion;
      a plurality of leads formed on a bottom surface of the horizontal portion of the substrate; and
      a plurality of grooves extending in a direction perpendicular to the front surface, each of the plurality of grooves extending through the entire length of the horizontal portion of the substrate and a lower part of the vertical portion of the substrate, wherein each of the leads is formed inside a respective one of the grooves;
   a MEMS die mounted on the mounting region of the substrate such that the MEMS die is oriented substantially parallel to the front surface; and
   a lid attached to the front surface of the substrate while covering the MEMS die.

2. The package of claim 1, wherein the leads extend substantially parallel to one another.

3. The package of claim 1, wherein the substrate has a height extending vertically from the bottom surface of the substrate to the top surface of the vertical portion, and a width extending perpendicular to the front surface and the height, and wherein a ratio of the height to the width is between about 0.2 and about 30.

4. The package of claim 1, wherein the substrate comprises a printed circuit board (PCB).

5. The package of claim 4, wherein the vertical portion and the horizontal portion of the substrate are laminated to each other.

6. The package of claim 1, wherein the substrate comprises a ceramic material or a plastic material.

7. The package of claim 1, further comprising bond pads on the mounting region of the substrate, and bond wires or bumps electrically coupled between the bond pads and the MEMS die.

8. The package of claim 7, further comprising a plurality of interconnects embedded in the vertical portion of the substrate, wherein a plurality of the interconnects are electrically coupled between one of the bond pads and a respective one of the leads.

9. The package of claim 1, further comprising a die mount on the mounting region of the substrate such that the die mount is interposed between the front surface of the substrate and the MEMS die.

10. The package of claim 1, wherein the lid comprises a conductive material which is configured to be electrically coupled to electrical ground.

11. The package of claim 10, wherein the lid is formed of a metal.

12. The package of claim 10, wherein the lid comprises a plastic material coated with the conductive material.

13. The package of claim 1, further comprising solder or conductive epoxy interposed between the lid and the first surface of the substrate.

14. The package of claim 1, wherein the grooves are open in directions in which the front and back surfaces face such that end portions of the leads are visible when viewed from either the front or back side of the package.

15. The package of claim 14, wherein the substrate further comprises a first pad extending from one of the end portions of one of the leads, and wherein the first pad is formed on a vertical surface of the horizontal portion.

16. The package of claim 15, wherein the substrate further comprises a second pad extending from another of the end portions of the lead, and wherein the second pad is formed on the vertical back surface of the horizontal portion.

17. The package of claim 1, wherein the leads have concave bottom surfaces.

18. The package of claim 1, further comprising an electromagnetic interference (EMI) shield conductive plate on the back surface of the vertical portion or embedded in the vertical portion.

19. The package of claim 1, further comprising an EMI shield conductive paddle formed on the mounting region of the substrate such that the paddle is interposed between the MEMS die and the front surface of the vertical portion.

20. The package of claim 1, further comprising a plurality of additional leads formed on a portion of the back surface of the vertical portion, the additional leads being spaced apart from the plurality of leads.

21. The package of claim 1, wherein the MEMS die comprises a gyroscope or accelerometer.

22. A substrate for a microelectromechanical systems (MEMS) package comprising:
a substrate having an L-shaped cross-section, the substrate comprising:
a vertical portion having a vertical front surface and a vertical back surface, wherein the vertical portion includes a mounting region on the front surface, bond pads on the mounting region, and interconnects electrically coupled to the bond pads;
a horizontal portion protruding horizontally from a lower part of the front surface of the vertical portion, wherein the front surface of the vertical portion includes a mounting region;
a plurality of leads formed on a bottom surface of the horizontal portion of the substrate; and
a plurality of grooves extending through the horizontal portion of the substrate and a lower part of the vertical portion of the substrate, the grooves extending through the entire length of the horizontal portion of the substrate and a lower part of the vertical portion of the substrate, wherein each of the leads is formed inside a respective one of the grooves.

23. The substrate of claim 22, wherein the leads extend substantially parallel to one another.

24. The substrate of claim 22, further comprising a lid attachable to the front surface of the vertical portion, the lid being configured to cover the mounting region while having a cavity formed on the mounting region.

25. A method of making a microelectromechanical systems (MEMS) package, the method comprising:
providing a substrate comprising a first portion having a first surface including a plurality of die mounting regions, and a second portion elevated from the first surface of the first portion, wherein the second portion is positioned outside the mounting regions, wherein the substrate further comprises a plurality of through-holes formed through the second portion, and a conductive material at least partially filling the through-holes; and
partitioning the substrate into individual MEMS packages such that each of the MEMS packages includes:
a vertical portion having a vertical front surface and a vertical back surface, wherein the front surface of the vertical portion includes one of the mounting regions;
a horizontal portion protruding horizontally from a lower part of the front surface of the vertical portion; and
a plurality of leads formed on a bottom surface of the horizontal portion of the substrate; and
a plurality of grooves defined by portions of the through-holes at least partially filled with the conductive material, the plurality of grooves extending in a direction perpendicular to the front surface, each of the plurality of grooves extending through the entire length of the horizontal portion of the substrate and a lower part of the vertical portion of the substrate, wherein each of the leads comprises the conductive material inside a respective one of the grooves.

26. The method of claim 25, wherein providing the substrate further comprises forming a conductive material on a portion of a top surface of the second portion such that the conductive material extends from the conductive material formed on the inner surfaces of the through-holes.

27. The method of claim 25, wherein providing the substrate further comprises forming a conductive material on a portion of a bottom surface of the second portion such that the conductive material extends from the conductive material formed on the inner surfaces of the through-holes.

28. The method of claim 25, wherein providing the substrate comprises coating the conductive material on the inner surfaces of the through-holes, and filling the through-holes with a conductive or non-conductive material.

29. The method of claim 25, further comprising, before partitioning the substrate:
mounting one or more MEMS dies on each of the mounting regions; and
attaching a plurality of lids to the first surface of the first substrate such that each of the lids covers a respective one of the mounting regions.

30. The method of claim 25, wherein providing the substrate comprises:
providing a first printed circuit board (PCB) having a first surface including the mounting regions;
attaching a second PCB to the first surface of the first PCB, wherein the second PCB is smaller in area than the first substrate, thereby forming the second portion of the substrate;
forming the through-holes through the second portion of the substrate; and
depositing the conductive material on the inner surfaces of the through-holes.

31. The method of claim 30, wherein providing the substrate further comprises depositing the conductive material on portions of top and bottom surfaces of the second portion such that the conductive material extends from the conductive material on the inner surfaces of the through-holes.

32. The method of claim 30, wherein the first PCB includes the mounting regions arranged in at least two rows,
wherein attaching the second PCB comprises attaching the second PCB between two of the rows, and
wherein partitioning the substrate comprises:
sawing the second portion of the substrate in a first direction to separate adjacent rows, and cut the through-holes substantially in half, and
sawing the substrate in a second direction to separate individual ones of the mounting regions.

33. A method of making a microelectromechanical systems (MEMS) package, the method comprising:
providing a substrate having an L-shaped cross-section, the substrate comprising:
a vertical portion having a vertical front surface and a vertical back surface, the front surface including a mounting region;
a horizontal portion protruding horizontally from a lower part of the front surface of the vertical portion;
a plurality of leads formed on a bottom surface of the horizontal portion of the substrate; and
a plurality of grooves extending through the horizontal portion of the substrate and a lower part of the vertical portion of the substrate, the grooves extending through the entire length of the horizontal portion of the substrate and a lower part of the vertical portion of the substrate, wherein each of the leads is formed inside a respective one of the grooves;
mounting one or more MEMS dies on the mounting region of the substrate such that the MEMS dies are oriented substantially parallel to the front surface; and
attaching a lid to the front surface of the substrate so as to cover the one or more MEMS dies.

34. The method of claim 33, wherein the leads extend substantially parallel to one another.

* * * * *